US010921863B2

(12) United States Patent
Gault et al.

(10) Patent No.: US 10,921,863 B2
(45) Date of Patent: Feb. 16, 2021

(54) VIRTUAL PIVOT HINGE WITH MULTI-PART FRICTION LINKAGE

(71) Applicant: Microsoft Technology Licensing, LLC, Redmond, WA (US)

(72) Inventors: Joseph Benjamin Gault, Seattle, WA (US); Brian D. Bitz, Woodinville, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/235,766

(22) Filed: Dec. 28, 2018

(65) Prior Publication Data

US 2020/0133351 A1 Apr. 30, 2020

Related U.S. Application Data

(60) Provisional application No. 62/752,032, filed on Oct. 29, 2018.

(51) Int. Cl.
*G06F 1/16* (2006.01)
*H05K 5/00* (2006.01)
*H05K 5/02* (2006.01)

(52) U.S. Cl.
CPC .......... *G06F 1/1681* (2013.01); *G06F 1/1618* (2013.01); *G06F 1/1656* (2013.01);
(Continued)

(58) Field of Classification Search
CPC .............................. G06F 1/1616; G06F 1/1681
See application file for complete search history.

(56) References Cited

U.S. PATENT DOCUMENTS 6,930,881 B2    8/2005  Karidis
8,687,361 B2 *  4/2014  Pegg ................... H04M 1/0218
                                                345/168

(Continued)

FOREIGN PATENT DOCUMENTS

CN    101874672 A    11/2010
EP      2728432 A1     5/2014
WO   2017086996 A1     5/2017

OTHER PUBLICATIONS

Asus VivoBook Touch S300CA-C1004H Intel ivybridge i3-3217U 1.80GHz CPU / 4GB DDR3 RAM on Board / 500GB HDD / 13.3" HD 1366×768 Touch LED Screen / Intel HD Graphics 4000 / Windows 8 / Intel core i3 Touch Screen Notebook [NBAS300CC1004H].

(Continued)

*Primary Examiner* — Hoa C Nguyen
*Assistant Examiner* — Keith DePew
(74) *Attorney, Agent, or Firm* — Holzer Patel Drennan

(57) ABSTRACT

Conventional laptop computers may utilize a door-hinge style or in a bezel-behind-base style hinge to connect a display with a keyboard of the laptop computer. Typically, these hinges present a discontinuous visual impression to the user. Presenting a more continuous visual impression of the hinge to the user suggests a higher overall quality of the computing device to the user and is thus desirable to the user. The disclosed virtual pivot hinge pivots about a pivot axis running between the display and the keyboard. The hardware of the hinge is located away from the pivot axis, which creates a virtual pivoting action about the axis that maintains a consistent front gap distance (or no front gap) between the display and the keyboard. The resulting visual impression to the user is that the display is floating above keyboard at the same or similar distance regardless of the display angle.

19 Claims, 10 Drawing Sheets

(52) U.S. Cl.
CPC ......... *H05K 5/0017* (2013.01); *H05K 5/0226* (2013.01); *G06F 1/1616* (2013.01)

(56) References Cited

U.S. PATENT DOCUMENTS

| | | | | |
|---|---|---|---|---|
| 8,763,206 B1* | 7/2014 | Gong | ..................... | E05D 1/04 |
| | | | | 16/355 |
| 9,189,032 B2* | 11/2015 | Jheng | ................... | G06F 1/1681 |
| 9,366,064 B1* | 6/2016 | Chen | ......................... | E05D 3/12 |
| 9,372,504 B2* | 6/2016 | Han | ........................ | E05D 1/04 |
| 9,404,298 B1* | 8/2016 | Chen | ................... | G06F 1/1681 |
| 9,447,620 B2* | 9/2016 | Park | ....................... | E05D 11/10 |
| 9,518,414 B1 | 12/2016 | Chen et al. | | |
| 9,523,226 B1 | 12/2016 | Lam et al. | | |
| 9,740,253 B2 | 8/2017 | Cheng et al. | | |
| 9,864,415 B2* | 1/2018 | Siddiqui | ............... | E05D 11/082 |
| 9,946,301 B2 | 4/2018 | Lan et al. | | |
| 10,001,162 B2* | 6/2018 | Hsu | ..................... | G06F 1/1681 |
| 10,001,815 B1 | 6/2018 | Yao et al. | | |
| 10,037,057 B2* | 7/2018 | Schafer | ................ | G06F 1/1681 |
| 10,066,429 B2* | 9/2018 | Park | ........................ | E05D 1/04 |
| 10,168,746 B2 | 1/2019 | Senatori | | |
| 10,185,355 B2* | 1/2019 | Watamura | ............. | G06F 1/1681 |
| 10,228,732 B2 | 3/2019 | Tomky et al. | | |
| 10,296,056 B2 | 5/2019 | Senatori | | |
| 10,309,137 B2* | 6/2019 | Wu | ....................... | G06F 1/1681 |
| 10,344,797 B2* | 7/2019 | Park | ...................... | F16C 11/103 |
| 10,358,853 B2 | 7/2019 | Tomky | | |
| 10,545,540 B2 | 1/2020 | Wendt | | |
| 10,656,685 B2 | 5/2020 | Cheng et al. | | |
| 2006/0226040 A1 | 10/2006 | Medina | | |
| 2012/0227217 A1* | 9/2012 | Chen | .................... | G06F 1/1681 |
| | | | | 16/366 |
| 2013/0308263 A1 | 11/2013 | Dondurur et al. | | |
| 2015/0016054 A1 | 1/2015 | Tsai | | |
| 2016/0097227 A1* | 4/2016 | Hsu | ......................... | G06F 1/16 |
| | | | | 16/354 |
| 2017/0292302 A1 | 10/2017 | Tomky | | |
| 2018/0087563 A1* | 3/2018 | Hsu | ..................... | G06F 1/1681 |
| 2018/0224899 A1 | 8/2018 | Senatori | | |
| 2018/0224901 A1 | 8/2018 | Senatori | | |
| 2018/0292860 A1* | 10/2018 | Siddiqui | ............... | G06F 1/1618 |
| 2020/0133350 A1 | 4/2020 | Gault et al. | | |
| 2020/0267859 A1 | 8/2020 | Kim et al. | | |

OTHER PUBLICATIONS

"International Search Report and Written Opinion Issued in PCT Application No. PCT/US19/056418", dated Jan. 23, 2020, 12 Pages.
"International Search Report and Written Opinion Issued in PCT Application No. PCT/US19/056627", dated Jan. 29, 2020, 11 Pages.
"Non-Final Office Action Issued in U.S. Appl. No. 16/235,623", dated Oct. 6, 2020, 17 pages.

* cited by examiner

VIRTUAL PIVOT HINGE WITH MULTI-PART FRICTION LINKAGE

BACKGROUND

Computing devices encompass a variety of devices that can be programmed to carry out one or more specific sets of arithmetic and/or logical operations, with or without user input. Some computing devices utilize one or more hinges to pivotally connect two or more components of the computing device. Conventionally, such computing device hinges often take the form of a door-hinge style or a bezel-behind-base style.

SUMMARY

Implementations described and claimed herein provide a virtual pivot hinge comprising a pivot element connecting a first hinged component to a second hinged component pivotable about a hinge pivot axis and a friction element also connecting the first hinged component to the second hinged component. The friction element includes a first friction arm with a first pivot end rotatable with reference to the first hinged component and a second pivot end extending away from the first hinged component, and a second friction arm with a third pivot end rotatable with reference to the second hinged component and a fourth pivot end extending away from the first hinged component and rotatably connected to the second pivot end of the first friction arm, wherein none of pivot axes of the first, second, third, and fourth pivot ends are coincident with the hinge pivot axis.

Implementations described and claimed herein further provide a method of manufacturing a virtual pivot hinge for a computing device comprising creating a pivot element pivotable about a hinge pivot axis, connecting a first hinged component to a second hinged component with the pivot element, creating a friction element, and connecting the first hinged component to the second hinged component with the friction element via a first friction arm and a second friction arm. The friction element includes the first friction arm with a first pivot end rotatable with reference to the first hinged component and a second pivot end extending away from the first hinged component, and the second friction arm with a third pivot end rotatable with reference to the second hinged component and a fourth pivot end extending away from the first hinged component and rotatably connected to the second pivot end of the first friction arm, wherein none of pivot axes of the first, second, third, and fourth pivot ends are coincident with the hinge pivot axis.

Implementations described and claimed herein still further provide a computing device comprising a first hinged component, a second hinged component, a pivot element connecting the first hinged component to the second hinged component pivotable about a hinge pivot axis, and a friction element also connecting the first hinged component to the second hinged component. The friction element includes a first friction arm with a first pivot end rotatable with reference to the first hinged component and a second pivot end extending away from the first hinged component, and a second friction arm with a third pivot end rotatable with reference to the second hinged component and a fourth pivot end extending away from the first hinged component and rotatably connected to the second pivot end of the first friction arm, wherein none of pivot axes of the first, second, third, and fourth pivot ends are coincident with the hinge pivot axis.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTIONS

A conventional door-hinge style hinge typically utilizes a pair of hinges located at or near endpoints of the hinged connection between the hinged components. Door-hinge style hinges are visibly contiguous with one of the hinged components, and rotatable with regard to the other of the hinged components. A visible gap is present between the door-hinge style hinges and within the hinged connection beyond the door-hinge style hinges. The door-hinge style hinge yields a discontinuous visual impression of the hinge to the user as hinge varies between a visual gap between the hinged components and continuity created by the door-hinge style hinges.

A conventional bezel-behind-base style hinge typically utilizes a singular central hinge, or a pair of hinges connected to one of the hinged components within a bezel of the hinged component. As with the door-hinge style hinges, the bezel-behind-base style hinges are visibly contiguous with one of the hinged components and rotatable with regard to the other of the hinged components. When opened, the bezel of one of the hinged components drops behind the other of the hinged components, thus reducing the visible gap between the hinged components outside of the bezel-behind-base style hinge. However, the bezel-behind-base style hinge still yields a discontinuous visual impression of the hinge to the user as the visible gap is replaced by discontinuous visible portions of the hinged components, as well as some visible gap, dependent upon the user's viewing angle.

Conventional laptop computers may utilize a door-hinge style or in a bezel-behind-base style hinge to connect a display component with a keyboard component of the laptop computer. Other computing devices may have a similar configuration with two components connected via one or more hinges, either in a door-hinge style or in a bezel-behind-base style. In all computing devices, presenting a continuous visual impression of the hinge to the user suggests a higher overall quality of the computing device to the user, and is thus desirable.

Figure 1:
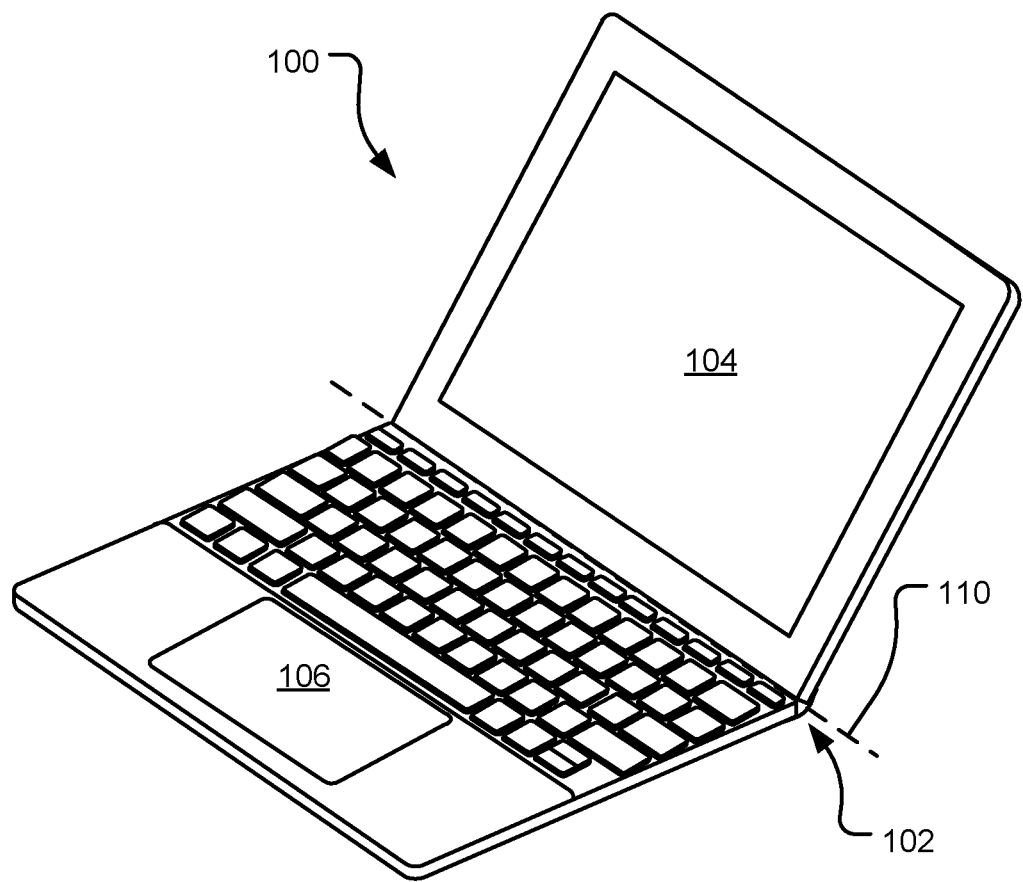
FIG. 1 is a perspective view of an example computing device having a virtual pivot hinge.

FIG. 1 is a perspective view of an example computing device 100 having a virtual pivot hinge 102. The hinge 102 pivotally connects a display component (or first hinged component) 104 with a keyboard component (or second hinged component) 106 of the device 100. As a result, a user may position the display component 104 at a variety of angles with respect to the keyboard component 106 to achieve a desired viewing angle to the display component 104, or for other user considerations. Further, the display component 104 may be selectively separable from the keyboard component 106.

The device 100 is depicted as a laptop computer, however, the hinge 102 may be similarly incorporated within a variety of computing devices, including mobile computing devices and desktop computing devices. Further, while the display component 104 and the keyboard component 106 are illustrated, and discussed in detail herein, the computing device 100 may include any two or more hinged components (e.g., a keyboard, a display screen, a touchscreen, a touchpad, a kickstand, a screen cover, and combinations thereof). For example, another computing device may be a 2-screen device and the hinge 102 may permit the 2-screen computing device to lay flat where the hinge 102 is oriented at 180-degrees and present the screens in close proximity to one another with only a small front gap or no front gap therebetween.

An example implementation of the hinge 102 is designed to pivot about pivot axis 110 running in free space (or within a front gap, not shown) between the display component 104 and the keyboard component 106. The hardware of the hinge 102, including both a pivot element and a friction element, is located away from the pivot axis 110, which creates a virtual pivoting action about the pivot axis 110 that maintains a consistent front gap distance between the display component 104 with a keyboard component 106. The visual impression to the user may be that the display component 104 is floating above keyboard component 106 due to the virtual pivot at the same or similar distance regardless of the display angle and no coincident hardware at the pivot axis 110.

Another example implementation of the hinge 102 is designed to pivot about pivot axis 110 running through living hinge material connecting the display component 104 to the keyboard component 106. The friction element hardware of the hinge 102 is located away from the pivot axis 110, which creates a virtual friction action about the pivot axis 110, while the living hinge maintains a consistent front gap distance between the display component 104 with a keyboard component 106.

In various implementations, the front gap distance between the display component 104 and the keyboard component 106 remains substantially the same (i.e., varies by no more than 10%) over an operating range of the hinge 102. The operating range of the hinge 102 may range from fully closed (or where the display component 104 overlies the keyboard component 106 with a 0-10 degree angle therebetween) to fully open (or where the display component 104 is oriented at a maximum oblique angle with reference to the keyboard component 106, which may include a 180-degree angle therebetween). In various implementations, the hinge 102 may have a 135-degree to 180-degree operating range. In other implementations, the hinge 102 may have an approximately 180-degree operating range or range of motion (i.e., 170-190 degrees).

Figure 2:
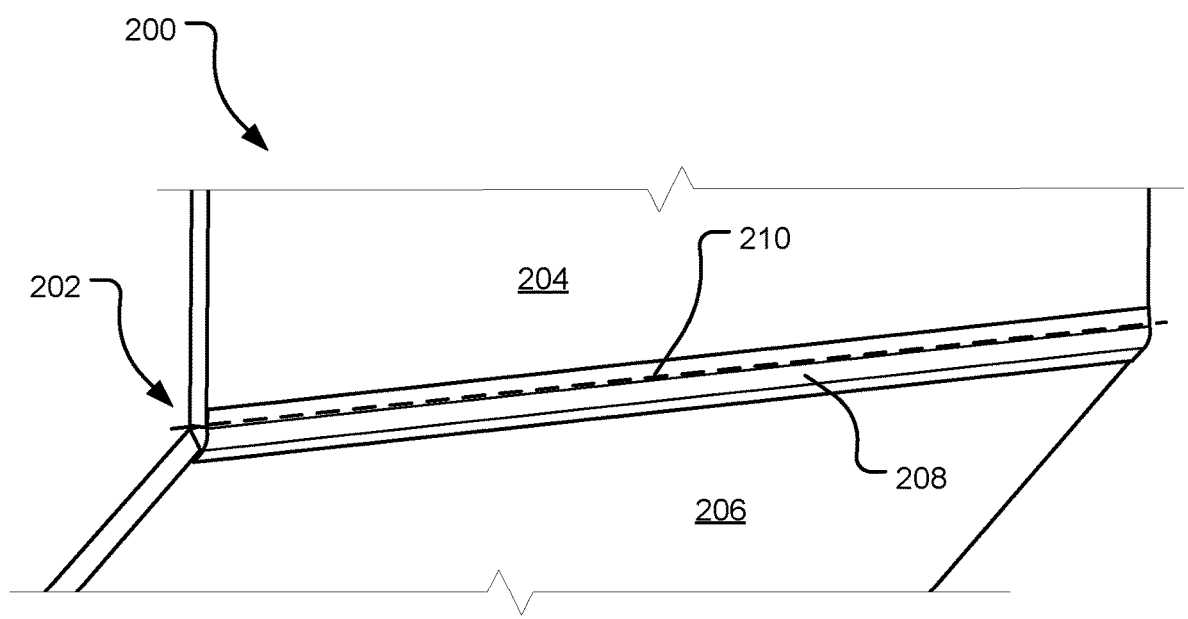
FIG. 2 is an exterior perspective view of an example virtual pivot hinge for a computing device including a flexible service loop.

FIG. 2 is an exterior perspective view of an example virtual pivot hinge 202 for a computing device 200 including a flexible service loop (or spine cover) 208. The hinge 202 pivotally connects a display component (or first hinged component) 204 with a keyboard component (or second hinged component) 206 of the computing device 200, though other hinged components may be used in further implementations. The hinge 202 pivots about pivot axis 210 running in free space or living hinge material (or within a front gap, not shown) between the display component 204 and the keyboard component 206. At least some of the hardware of the hinge 202 is located away from the pivot axis 210, which creates a virtual pivoting and/or friction action about the pivot axis 210 and maintains a consistent front gap distance between the display component 204 and the keyboard component 206.

As at least some of the hardware of the hinge 202 is located away from the front gap, it may be visible from behind the computing device 200 within a space (or a rear gap) between the display component 204 and the keyboard component 206. The flexible service loop 208 may be used to conceal the hardware of the hinge 202 from a user. The flexible service loop 208 is constructed from a flexible material (e.g., fabric, rubber, plastic, metal mesh) and is adhered or otherwise attached to each of the display component 204 and the keyboard component 206 and spans some or all of the rear gap.

As the distance between the display component 204 and the keyboard component 206 at the flexible service loop 208 varies as a function of hinge angle, the flexible service loop 208 functions as a living hinge and includes sufficient material to span the rear gap when the hinge angle is at a minimum value (resulting in a maximum rear gap), and is sufficiently flexible to accommodate the rear gap when the hinge angle is at a maximum value (resulting in a minimum rear gap).

Figure 3A:
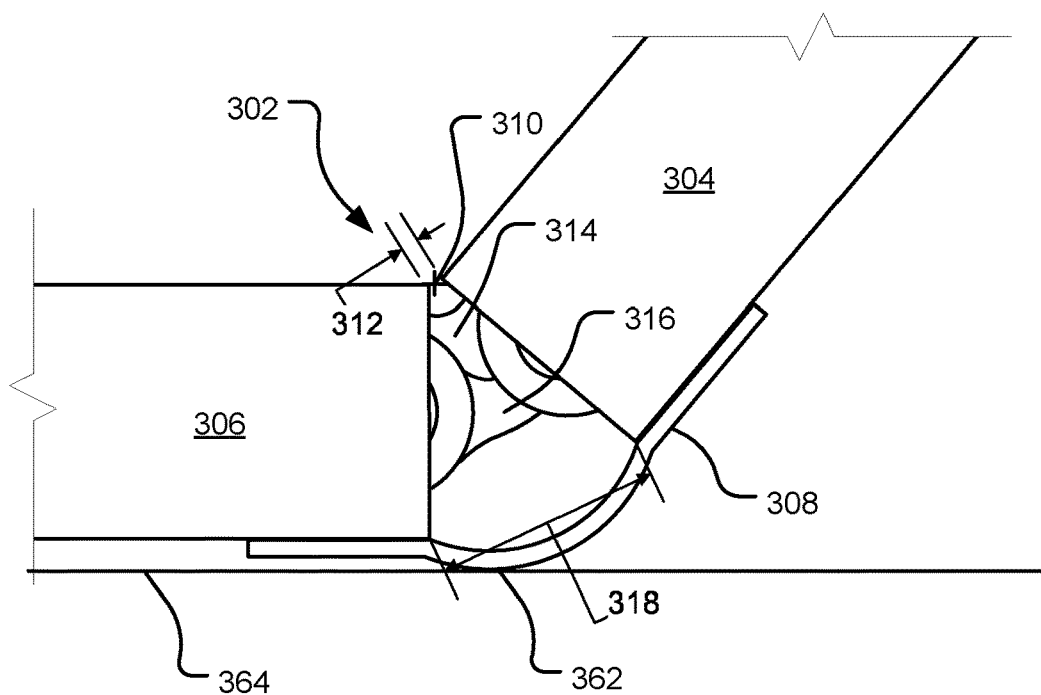
FIG. 3A is an elevation view of an example virtual pivot hinge with sliding friction element in an open orientation.

FIG. 3A is an elevation view of an example virtual pivot hinge 302 with sliding friction element 316 in an open orientation. The hinge 302 pivotally connects a first hinged component 304 with a second hinged component 306 and pivots about pivot axis 310 extending perpendicular to the depicted view of FIG. 3A and running in free space adjacent the hinge 302. In some implementations, the pivot axis 310 extends within or near a front gap 312 between the first hinged component 304 and the second hinged component 306.

The hinge 302 includes a pivot element 314 that connects the first hinged component 304 with the second hinged component 306 and constrains movement of the first hinged component 304 with respect to the second hinged component 306 to rotation about the pivot axis 310. The friction element 316 provides the hinge 302 resistance to rotation about the pivot axis 310. The pivot element 314 and the friction element 316 may be referred to herein as the hardware of the hinge 302 and are located away from the pivot axis 310. This creates a virtual pivoting action about the pivot axis 310 and yields a small front gap 312. In various implementations, the front gap 312 distance between the first hinged component 304 and the second hinged component 306 remains substantially the same over an operating range of the hinge 302. In various implementations, the operating range of the hinge 302 may range from fully open (e.g., illustrated at approximately 135 degrees in FIG. 3A) to fully closed (see e.g., FIG. 3B, discussed below).

As the hardware 314, 316 of the hinge 302 is located away from the front gap 312, it may be visible from behind the hinge 302 within a space (or rear gap) 318 between the first hinged component 304 and the second hinged component 306. A flexible service loop 308 may be used to conceal the hardware 314, 316 of the hinge 302 from a user. The flexible service loop 308 is adhered or otherwise attached to each of the first hinged component 304 and the second hinged component 306 opposite the pivot axis 310 and spans some or all of the rear gap 318.

As the distance between the first hinged component 304 and the second hinged component 306 at the flexible service loop 308 varies as a function of hinge 302 angle, the flexible service loop 308 functions as a living hinge and includes sufficient material to span the rear gap 318 when the hinge 302 angle is at a minimum value (see e.g., FIG. 3B, discussed below), and is sufficiently flexible to accommodate the rear gap when the hinge 102 angle is at a maximum value (e.g., as illustrated at approximately 135 degrees in FIG. 3A).

In various implementations, the flexible service loop 308 may also add stability to an associated computing device by moving a fulcrum (or point of contact) 362 for deflecting the hinge 302 rearward. This is accomplished by moving the point of contact 362 with a surface 364 that the computing device is resting upon from the hinged component 306 to the flexible service loop 308, as shown. Further, moving the point of contact 362 to the flexible service loop 308 may elevate a portion of the hinged component 306 near the hinge 302. The angled elevation may be beneficial when the hinged component 306 is a keyboard and the user may find the elevated position more ergonomically desirable. Still further, the flexible service loop 308 may be made with a gentle radius, as shown, which is aesthetically and tactilely pleasing to the user.

Figure 3B:
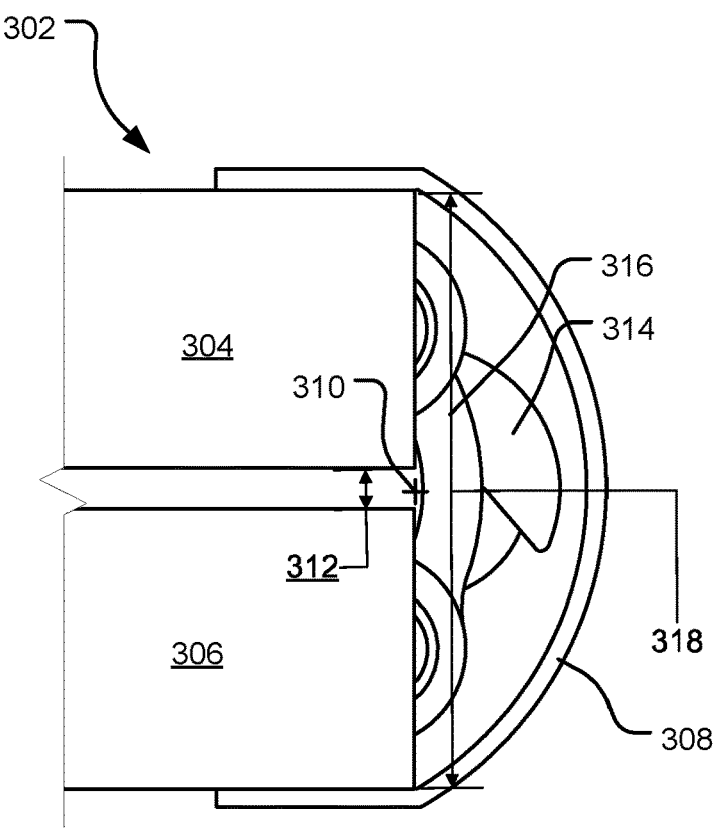
FIG. 3B is an elevation view of the example virtual pivot hinge of FIG. 3A in a closed orientation.

FIG. 3B is an elevation view of the example virtual pivot hinge 302 of FIG. 3A in a closed orientation. As discussed with reference to FIG. 3A, the hinge 302 pivotally connects the first hinged component 304 with the second hinged component 306 and pivots about the pivot axis 310 running in free space adjacent the hinge 302. In some implementations, the pivot axis 310 extends within or near the front gap 312 between the first hinged component 304 and the second hinged component 306.

As also discussed with reference to FIG. 3A, the hinge 302 includes the pivot element 314 that connects the first hinged component 304 with the second hinged component 306 and constrains movement of the first hinged component 304 with respect to the second hinged component 306 to rotation about the pivot axis 310. The hinge 302 also includes the friction element 316 that provides the hinge 302 resistance to rotation of the about the pivot axis 310. The pivot element 314 and the friction element 316 may be referred to herein as the hardware of the hinge 302 and are located away from the pivot axis 310. This creates the virtual pivoting action about the pivot axis 310. In various implementations, the front gap 312 distance between the first hinged component 304 and the second hinged component 306 remains substantially the same over an operating range of the hinge 302. In various implementations, the operating range of the hinge 302 may range from fully open (e.g., illustrated at approximately 135 degrees in FIG. 3A) to fully closed (e.g., as illustrated at approximately 0 degrees in FIG. 3B).

As the hardware 314, 316 of the hinge 302 is located away from the front gap 312, it may be visible from behind the hinge 302 within a space (or rear gap) 318 between the first hinged component 304 and the second hinged component 306. The flexible service loop 308 may be used to conceal the hardware 314, 316 of the hinge 302 from a user. The flexible service loop 308 is adhered or otherwise attached to each of the first hinged component 304 and the second hinged component 306 and spans some or all of the rear gap 318.

As the distance between the first hinged component 304 and the second hinged component 306 at the flexible service loop 308 varies as a function of hinge angle, the flexible service loop 308 functions as a living hinge and includes sufficient material to span the rear gap 318 when the hinge angle is at a minimum value (e.g., as illustrated at approximately 0 degrees in FIG. 3B), and is sufficiently flexible to accommodate the rear gap when the hinge angle is at a maximum value (e.g., as illustrated at approximately 135 degrees in FIG. 3A).

Figure 4:
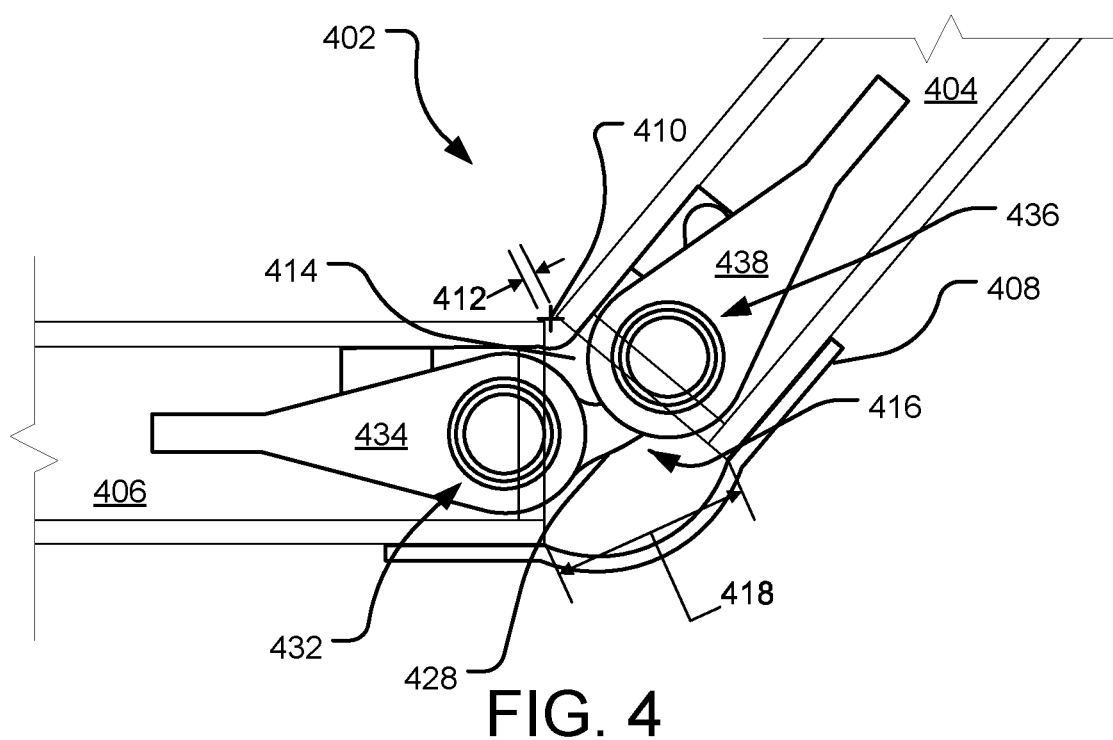
FIG. 4 is a sectional elevation view of an example virtual pivot hinge with sliding friction element in an open orientation.

FIG. 4 is a sectional elevation view of an example virtual pivot hinge 402 with sliding friction element 416 in an open orientation. The hinge 402 pivotally connects a first hinged component 404 with a second hinged component 406 and pivots about pivot axis 410 extending perpendicular to the depicted view of FIG. 4 and running in free space adjacent the hinge 402. In some implementations, the pivot axis 410 extends within or near a front gap 412 between the first hinged component 404 and the second hinged component 406. Both hinged components 404, 406 are illustrated transparently in FIG. 4 to reveal additional features of the virtual pivot hinge 402.

The hinge 402 includes a pivot element 414 that connects the first hinged component 404 with the second hinged component 406 and constrains movement of the first hinged component 404 with respect to the second hinged component 406 to rotation about the pivot axis 410. The friction element 416 provides the hinge 402 resistance to rotation of the about the pivot axis 410 and includes a friction arm 428 extending away from a first bearing 432 attached to the second hinged component 406 via bracket 434. A coupler (not shown, see e.g., coupler 730 of FIG. 7) is slidably connected to the friction arm 428 and in part forms a second bearing 436 attached to the first hinged component 404 via bracket 438. One of both of the bearings 432, 436 provide resistance to rotation, which in turn provides resistance to pivoting the first hinged component 404 with respect to the second hinged component 406 about the pivot axis 410.

The pivot element 414 and the friction element 416 may be referred to herein as the hardware of the hinge 402 and are located away from the pivot axis 410. This creates a virtual pivoting action about the pivot axis 410 that maintains a consistent front gap 412 distance between the first hinged component 404 and the second hinged component 406. In various implementations, the front gap 412 distance between the first hinged component 404 and the second hinged component 406 remains substantially the same over an operating range of the hinge 402.

As the hardware 414, 416 of the hinge 402 is located away from the front gap 412, it may be visible from behind the hinge 402 within a space (or rear gap) 418 between the first hinged component 404 and the second hinged component

406. A flexible service loop 408 may be used to conceal the hardware 414, 416 of the hinge 402 from a user. The flexible service loop 408 is adhered or otherwise attached to each of the first hinged component 404 and the second hinged component 406 and spans the rear gap 418.

As the distance between the first hinged component 404 and the second hinged component 406 at the flexible service loop 408 varies as a function of hinge angle, the flexible service loop 408 functions as a living hinge and includes sufficient material to span the rear gap 418 when the hinge angle is at a minimum value (see e.g., FIG. 3B), and is sufficiently flexible to accommodate the rear gap when the hinge angle is at a maximum value (e.g., as illustrated in FIG. 4).

Figure 5:
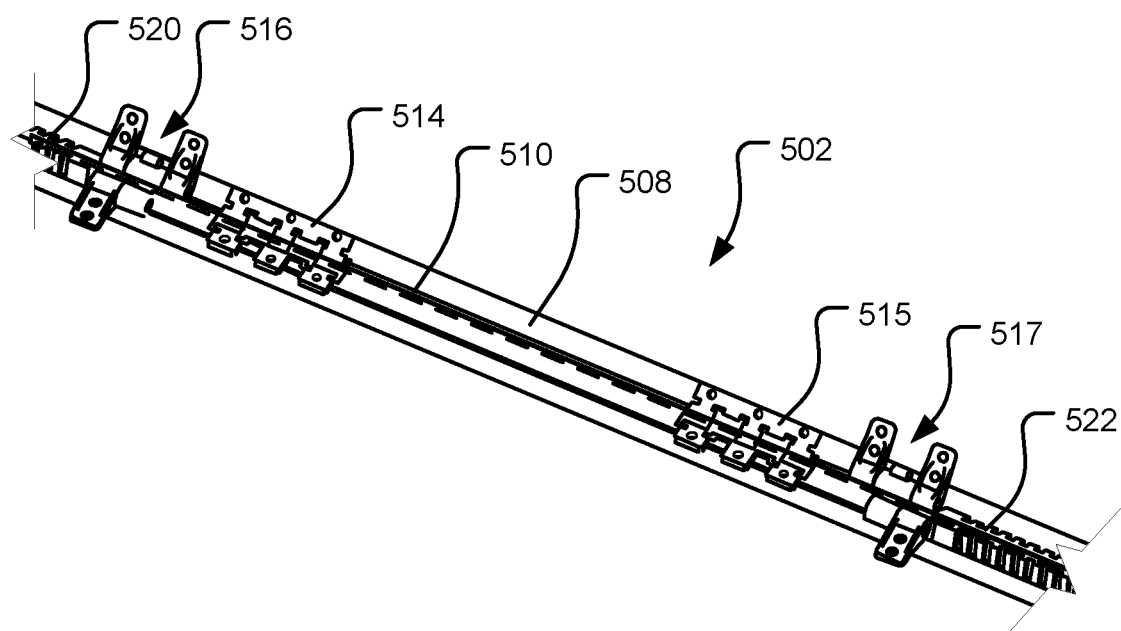
FIG. 5 is an interior perspective view of an example virtual pivot hinge with sliding friction elements.

FIG. 5 is an interior perspective view of an example virtual pivot hinge 502 with sliding friction elements 516, 517. The hinge 502 pivotally connects two hinged components (not shown, see e.g., hinged components 104, 106 of FIG. 1) and pivots about pivot axis 510 running in free space adjacent the hinge 502. In some implementations, the pivot axis 510 extends within or near a front gap (not shown, see e.g., front gap 312 of FIGS. 3A and 3B) between the hinged components. The hinge 502 includes a pair of pivot elements 514, 515 that connect the hinged components and constrain movement of the hinged components with reference to one another to rotation about the pivot axis 510. The friction elements 516, 517 provide the hinge 502 resistance to rotation about the pivot axis 510.

The pivot elements 514, 515 and the friction elements 516, 517 may be referred to herein as the hardware of the hinge 502 and are located away from the pivot axis 510. This creates a virtual pivoting action about the pivot axis 510 that maintains a consistent front gap distance between the hinged components. The pivot elements 514, 515 and the friction elements 516, 517 may also be oriented in separate physical locations along the pivot axis 510 and between the hinged components. In other implementations, a singular pivot element and/or a singular friction element may be used to construct the hinge 502. Alternatively, greater than two pivot elements and/or friction elements may be used to construct the hinge 502. The number and specific location of the pivot elements and friction elements is selected per the performance requirements of the hinge 502.

As the hardware 514, 515, 516, 517 of the hinge 502 is located away from the front gap, it may be visible from behind the hinge 502 within a space (or rear gap, not shown) between the hinged components. A flexible service loop 508 may be used to conceal the hardware 514, 515, 516, 517 of the hinge 502 from a user. The flexible service loop 508 is adhered or otherwise attached to each of the hinged components and spans the rear gap. As the distance between the hinged components at the flexible service loop 508 varies as a function of hinge angle, the flexible service loop 508 functions as a living hinge and includes sufficient material to span the rear gap when the hinge angle is at a minimum value, and is sufficiently flexible to accommodate the rear gap when the hinge angle is at a maximum value.

One or both of the hinged components may include venting apertures 520, 522 (e.g., for cooling purposes), electric and/or electronic connections (not shown), and/or other componentry adjacent the hinge 502. The flexible service loop 508 may further conceal the venting apertures 520, 522, electric and/or electronic connections (not shown), and other componentry as applicable, along with the hardware 514, 515, 516, 517 of the hinge 502 from the user. Further, the flexible service loop 508 may also be used to insulate the user from heat exiting an associated computing device via the venting apertures 520, 522. Still further, the flexible service loop 508 may include a pocket to store a stylus or writing instrument within the rear gap.

Figure 6:
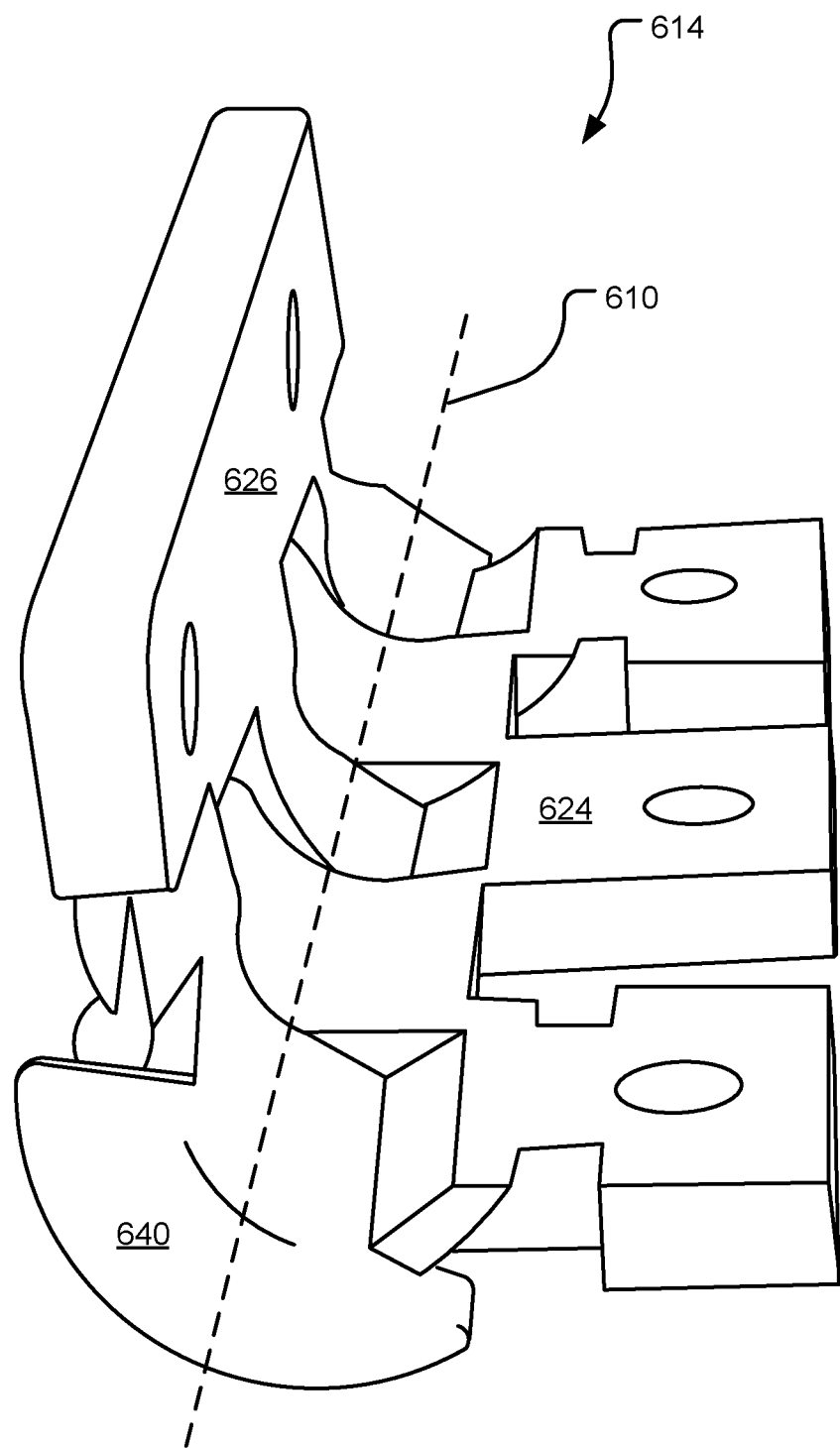
FIG. 6 is a perspective view of an example pivot element for a virtual pivot hinge.

FIG. 6 is a perspective view of an example pivot element 614 for a virtual pivot hinge (not shown, see e.g., hinge 302 of FIGS. 3A and 3B). The pivot element 614 connects two hinged components (not shown, see e.g., hinged components 304, 306 of FIGS. 3A and 3B) and constrains movement of the two hinged components with reference to one another to rotation about pivot axis 610. The pivot axis 610 runs in free space adjacent the pivot element 614. In various implementations, the pivot axis 610 may not occupy space where any hardware of the hinge is present, including the pivot element 614.

The pivot element 614 includes a pair of leaves 624, 626, each connected to and contiguous with a portion of a knuckle 640 of the pivot element 614. Portions of the knuckle 640 that are contiguous with the leaves 624, 626 alternate and each move within one or more channels formed by the other of the leaves 624, 626. The channels formed by the leaves 624, 626 and the knuckle 640 constrains relative movement of the leaves 624, 626, and therefore corresponding attached hinged components, to rotation about pivot axis 610. The channels may also or instead be telescoping guides or sliding tracks for the leaves 624, 626.

Figure 7:
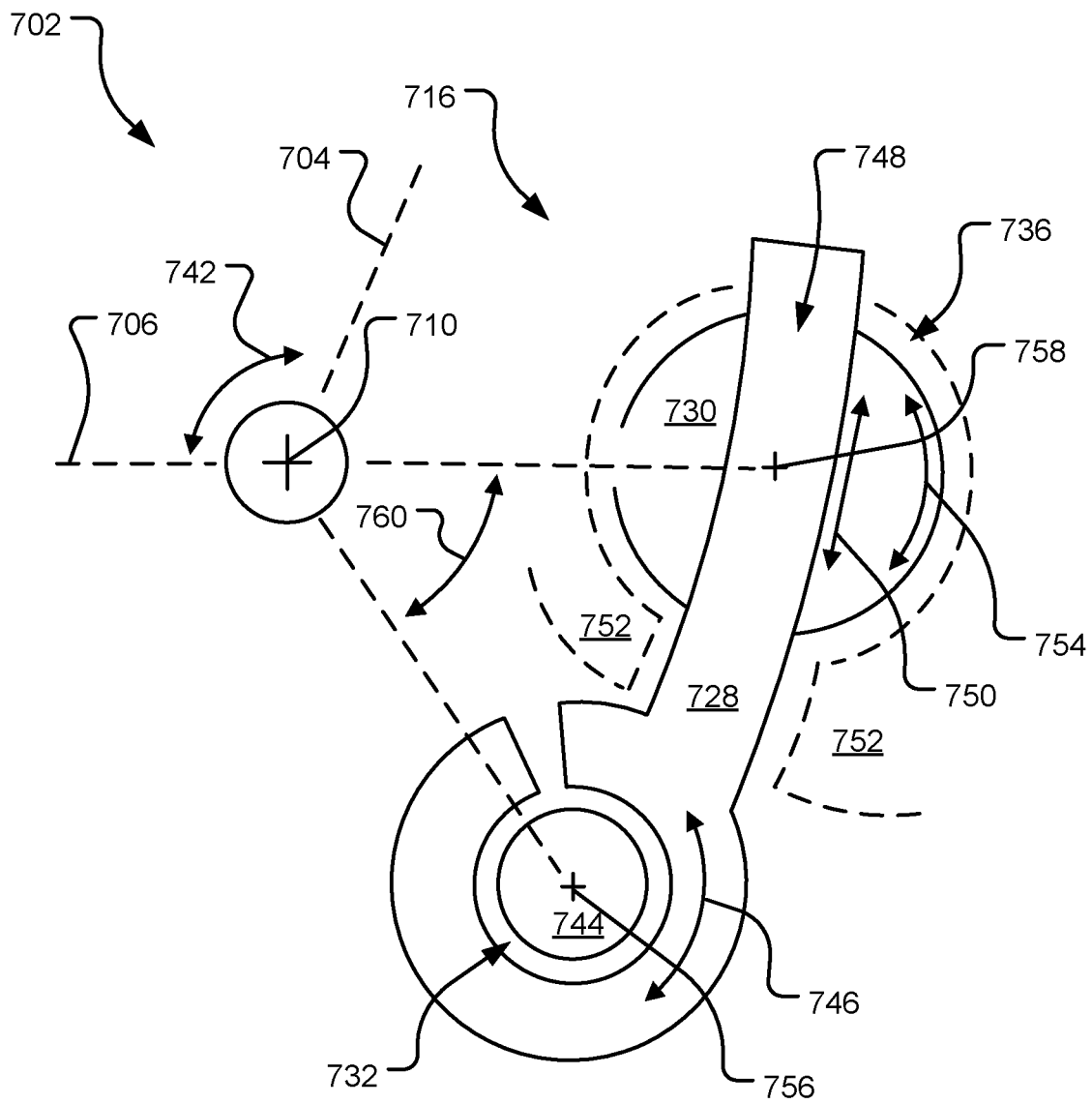
FIG. 7 is a schematic of an example sliding friction element for a virtual pivot hinge.

FIG. 7 is a schematic of an example sliding friction element 716 for a virtual pivot hinge 702. The hinge 702 pivotally connects a first hinged component 704 with a second hinged component 706 (each illustrated in FIG. 7 by dashed lines) and pivots about pivot axis 710 extending perpendicular to the depicted view of FIG. 7 and running in free space adjacent the hinge 702. The hinge 702 includes a pivot element (not shown, see e.g., pivot element 614 of FIG. 6) that connects the first hinged component 704 with the second hinged component 706 and constrains movement of the first hinged component 704 with respect to the second hinged component 706 to rotation about the pivot axis 710, as illustrated by arrow 742.

The friction element 716 provides the hinge 702 resistance to rotation of the about the pivot axis 710. The friction element 716 includes a friction arm 728 with a first end that encircles and is rotatable about a bearing journal 744 (as illustrated by arrow 746), which is fixed to the second hinged component 706. The bearing journal 744 may be affixed to the second hinged component 706 via one or more brackets (not shown, see e.g., bracket 434 of FIG. 4). The friction arm 728 and bearing journal 744 creates a first bearing 732 that may provide resistance to rotation, which in turn may provide resistance to pivoting the first hinged component 704 with respect to the second hinged component 706.

The friction arm 728 extends away from the first bearing 732 and projects through a slot 748 within a coupler 730. The coupler 730 is slidably connected to the friction arm 728 via extension and retraction along the friction arm 728, as illustrated by arrow 750, and in part forms a second bearing 736. The second bearing 736 also includes a bearing housing 752, which encircles the coupler 730 and is fixed to the first hinged component 704. The bearing housing 752 may be affixed to the first hinged component 704 via one or more brackets (not shown, see e.g., bracket 438 of FIG. 4). The coupler 730 is rotatable within the bearing housing 752 (as illustrated by arrow 754) as the coupler 730 slides along the friction arm 728.

One of both of the bearings 732, 736 provide resistance to rotation at their respective centers 756, 758. The sliding and rotational movement of the friction arm 728 and the coupler 730 permits the hinge 702 to rotate about the pivot axis 710, while providing the resistance to the rotation about the pivot axis 710 at one or both of bearings 732, 736. In some implementations, the bearing 732 provides the resistance to rotation, while the coupler 730 is relatively free to rotate and slide as the friction element 716 is rotated about the pivot axis 710.

In some implementations, one or both of the bearings 732, 736 may also include bias mechanisms to bias the friction element 716 to one or more specific positions. For example, the bearings 732, 736 may include indents and protrusions that match when the friction element 716 is placed at certain positions. In other implementation, the bearings 732, 736 may incorporate a cam profile that varies the resistance to rotation about either of the bearings 732, 736 depending on the friction element 716 position. Still further, the coupler 730 and slot 748 may also incorporate indents and protrusions that match when the friction element 716 is placed at certain positions.

Relative movement of the centers 756, 758 of the bearings 732, 736, as illustrated by arrow 760 with respect to one another is correlates to angular movement of the first hinged component 704 with respect to the second hinged component 706 about the pivot axis 710, as illustrated by arrow 742. As a result, the friction element 716 may be referred to as an off-axis friction element as the source of friction is not coincident with the pivot axis 710 of the friction element 716.

The pivot element and the friction element 716 may be referred to herein as the hardware of the hinge 702 and are located away from the pivot axis 710, as shown in FIG. 7. This creates a virtual pivoting action about the pivot axis 710 that maintains a consistent front gap distance (not shown, see e.g., front gap 412 of FIG. 4) between the first hinged component 704 and the second hinged component 706 across a variety of pivot angles. In various implementations, the front gap distance between the first hinged component 704 and the second hinged component 706 remains substantially the same over an operating range of the hinge 702.

Figure 8A:
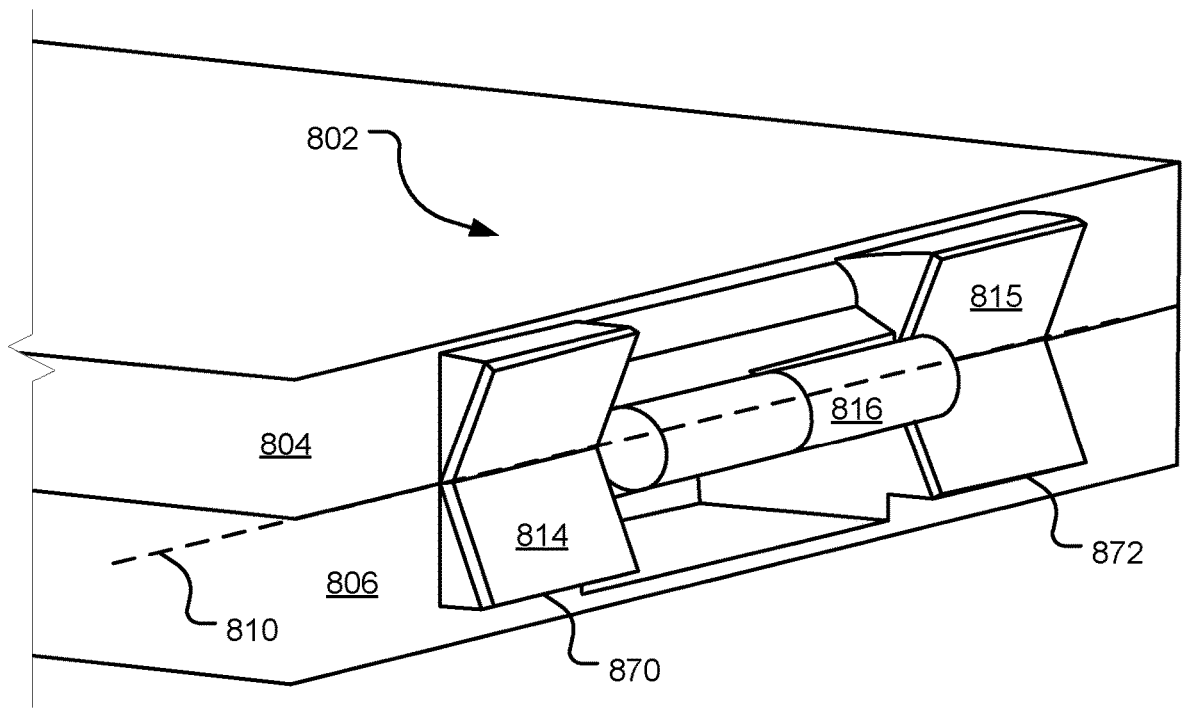
FIG. 8A is a perspective view of an example virtual pivot hinge with multi-part friction linkage element in a closed orientation.

FIG. 8A is a perspective view of an example virtual pivot hinge 802 with multi-part friction linkage element 816 in a closed orientation. The hinge 802 pivotally connects a first hinged component 804 with a second hinged component 806 and pivots about pivot axis 810 running through living hinges 814, 815 connecting the components 804, 806. In some implementations, the pivot axis 810 extends within or near a front gap (not shown) between the components 804, 806.

The hinge 802 includes a pair of living hinges 814, 815 oriented on each side of the multi-part friction linkage element 816 and connecting hard stops 870, 872, respectively, together. In other implementations, the living hinges 814, 815 connect the components 804, 806 independently of the hard stops 870, 872, which may or may not be present. The living hinges 814, 815 constrain movement of the first hinged component 804 with respect to the second hinged component 806 to rotation about the pivot axis 810. The friction element 816 provides the hinge 802 resistance to rotation about the pivot axis 810. The living hinges 814, 815 and the friction element 816 may be referred to herein as the hardware of the hinge 802 and at least the friction element 816 is located away from the pivot axis 810 (see e.g., FIGS. 9A and 9B). This creates virtual friction action about the pivot axis 810 and yields no front gap (or in other implementations, a small front gap).

Figure 8B:
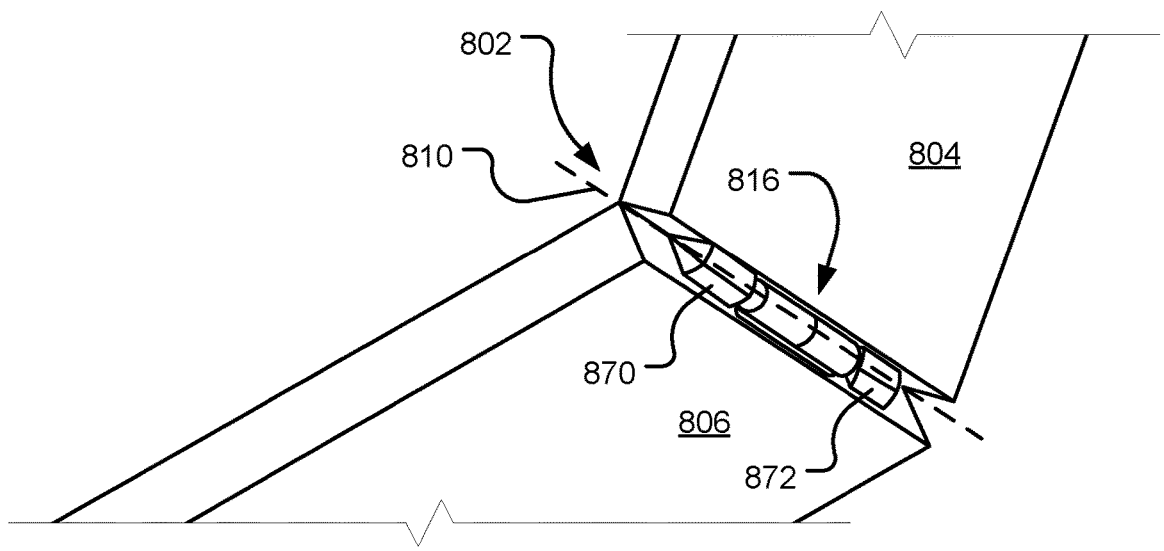
FIG. 8B is a perspective view of the example virtual pivot hinge of FIG. 8A in an open orientation.

FIG. 8B is a perspective view of the example virtual pivot hinge 802 of FIG. 8A in an open orientation. As discussed with reference to FIG. 8A, the hinge 802 pivotally connects the first hinged component 804 with the second hinged component 806 and pivots about the pivot axis 810 through living hinges 814, 815 connecting the components 804, 806. In some implementations, the pivot axis 810 extends within or near a front gap (not shown) between the components 804, 806.

As also discussed with reference to FIG. 8A, the hinge 802 includes the pair of living hinges 814, 815 oriented on each side of the multi-part friction linkage element 816 and connecting hard stops 870, 872, respectively, together. In other implementations, the living hinges 814, 815 connect the components 804, 806 independently of the hard stops 870, 872, which may or may not be present. The living hinges 814, 815 constrain movement of the first hinged component 804 with respect to the second hinged component 806 to rotation about the pivot axis 810. The friction element 816 provides the hinge 802 resistance to rotation about the pivot axis 810. The living hinges 814, 815 and the friction element 816 may be referred to herein as the hardware of the hinge 802 and at least the friction element 816 is located away from the pivot axis 810 (see e.g., FIGS. 9A and 9B). This creates virtual friction action about the pivot axis 810 and yields no front gap (or in other implementations, a small front gap). In various implementations, the operating range of the hinge 802 may range from fully open (e.g., illustrated at approximately 135 degrees in FIG. 8B) to fully closed (e.g., as illustrated at approximately 0 degrees in FIG. 8A). In various implementations, the operating range of the hinge 802 is limited by the hard stops 870, 872 contacting, as shown in FIG. 8B.

Figure 9A:
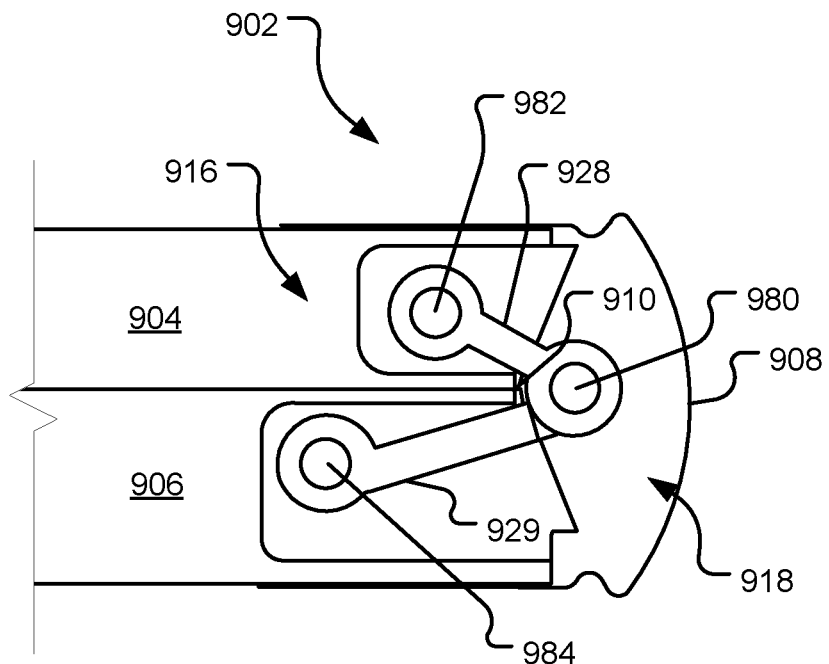
FIG. 9A is a sectional elevation view of an example virtual pivot hinge with multi-part friction linkage element in a closed orientation.

FIG. 9A is a sectional elevation view of an example virtual pivot hinge 902 with multi-part friction linkage element 916 in a closed orientation. The hinge 902 includes a pivot element (not shown) that connects a first hinged component 904 with a second hinged component 906 and constrains movement of the first hinged component 904 with respect to the second hinged component 906 to rotation about the pivot axis 910. In some implementations, the pivot axis 910 extends perpendicular to the depicted view of FIGS. 9A and 9B and runs in free space adjacent the hinge 902. In other implementations, the pivot axis 910 runs through living hinges (not shown, see e.g., living hinges 814, 815 of FIGS. 8A and 8B) connecting the components 904, 906. Both hinged components 904, 906 are illustrated transparently in FIGS. 9A and 9B to reveal additional features of the multi-part friction linkage element 916.

The friction linkage element 916 provides the hinge 902 resistance to rotation of the about the pivot axis 910 and includes a pair of friction arms 928, 929, each with a pair of pivot ends. One pivot end of each of the friction arms 928, 929 is connected to the other at pivot 980. Opposite pivot ends of the friction arms 928, 929 are connected to the first hinged component 904 and the second hinged component 906 at pivots 982, 984, respectively. The friction arms 928, 929 extend away from the hinged components 904, 906, respectively, and meet at the pivot 980. None of the pivots 982, 984 are coincident with the pivot axis 910 at any hinge angle. However, one or more of the pivots 980, 982, 984 provide resistance to rotation, which in turn provides resistance to pivoting the first hinged component 904 with respect to the second hinged component 906 about the pivot axis 910.

The friction linkage element 916 may be referred to herein as the hardware of the hinge 902 and is located away from the pivot axis 910. This creates virtual friction action about the pivot axis 910 that maintains a consistent front gap distance (or no front gap) between the first hinged component 904 and the second hinged component 906. In various implementations, the front gap distance between the first hinged component 904 and the second hinged component 906 remains substantially the same over an operating range of the hinge 902.

As the hardware 916 of the hinge 902 is located away from the pivot axis 910, it may be visible from behind the hinge 902 within a space (or rear gap) 918 between the first hinged component 904 and the second hinged component 906. A flexible service loop 908 may be used to conceal the hardware 916 of the hinge 902 from a user. The flexible service loop 908 is adhered or otherwise attached to each of the first hinged component 904 and the second hinged component 906 and spans the rear gap 918.

Figure 9B:
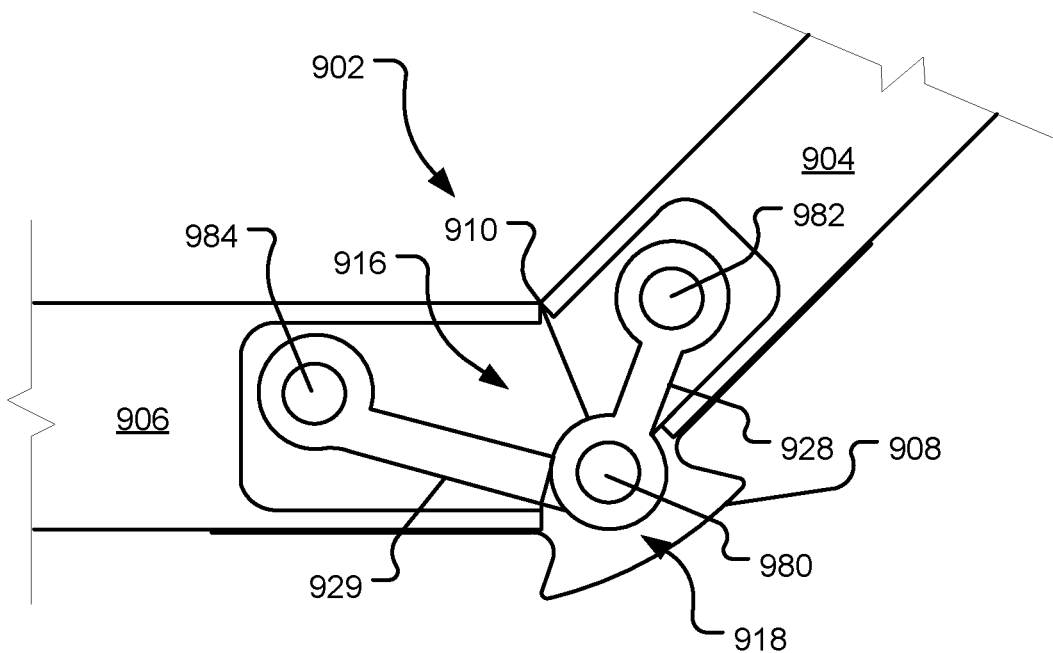
FIG. 9B is a sectional elevation view of the example virtual pivot hinge of FIG. 9A in an open orientation.

FIG. 9B is a sectional elevation view of the example virtual pivot hinge 902 of FIG. 9A in an open orientation. The friction linkage element 916 provides the hinge 902 resistance to rotation of the about the pivot axis 910 and includes a pair of friction arms 928, 929, each with a pair of pivot ends. One pivot end of each of the friction arms 928, 929 is connected to the other at pivot 980. Opposite pivot ends of the friction arms 928, 929 are connected to the first hinged component 904 and the second hinged component 906 at pivots 982, 984, respectively. The friction arms 928, 929 extend away from the hinged components 904, 906, respectively, and meet at the pivot 980. None of the pivots 982, 984 are coincident with the pivot axis 910 at any hinge angle. However, one or more of the pivots 980, 982, 984 provide resistance to rotation, which in turn provides resistance to pivoting the first hinged component 904 with respect to the second hinged component 906 about the pivot axis 910.

As the distance between the first hinged component 904 and the second hinged component 906 at the flexible service loop 908 varies as a function of hinge angle, the flexible service loop 908 functions as a living hinge and includes sufficient material to span the rear gap 918 when the hinge angle is at a minimum value (see e.g., FIG. 9A), and is sufficiently flexible to accommodate the rear gap when the hinge angle is at a maximum value (see e.g., FIG. 9B).

Figure 10:
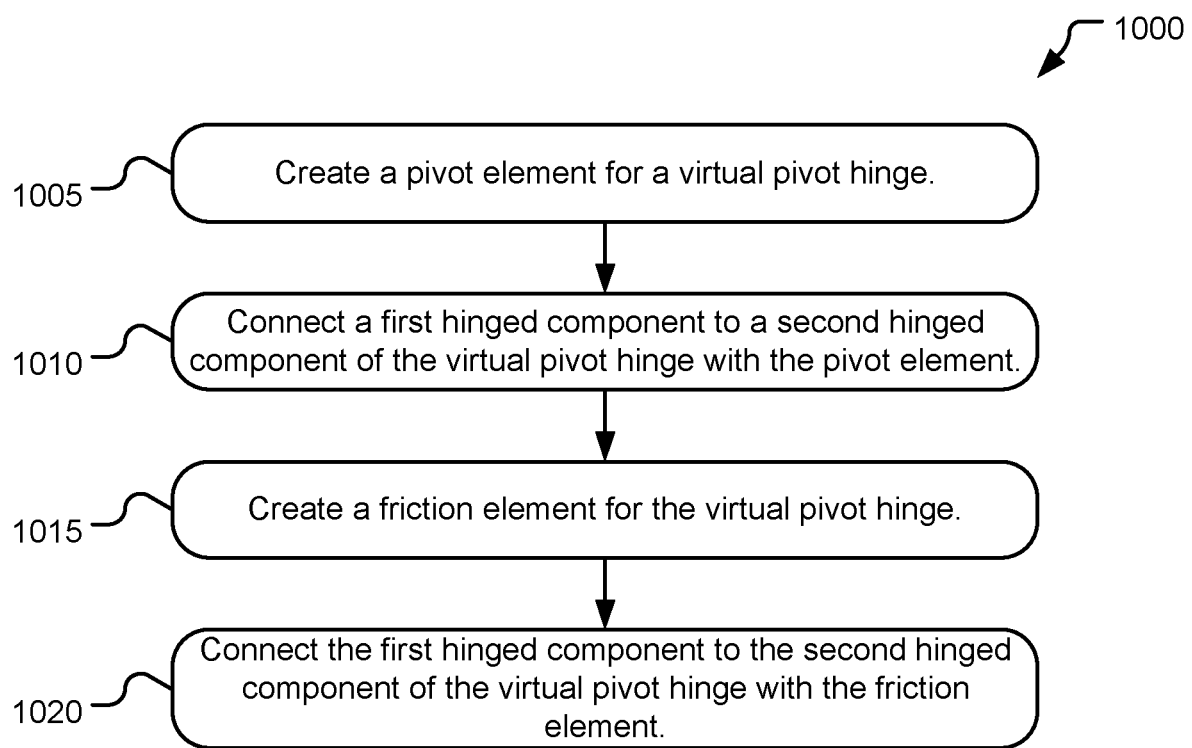
FIG. 10 illustrates example operations for manufacturing a virtual pivot hinge for a computing device.

FIG. 10 illustrates example operations 1000 for manufacturing a virtual pivot hinge for a computing device. A first creating operation 1005 creates a pivot element for the virtual pivot hinge. In one implementation, the pivot element projects a pivot axis into free space adjacent the pivot element. For example, the first creating operation 1005 may include forming a first leaf, forming a second leaf, and interleaving the formed leaves of the pivot element in a manner that constrains motion of the pivot element to angular motion about the pivot axis. Specifically, portions of the first leaf may move within channels formed by portions of second leaf at a barrel of the pivot element, and vice versa. The channels constrain the motion of the pivot element. The leaves of the pivot element may be formed using any applicable manufacturing method (e.g., metal-injection molding, other molding techniques, extruding, casting, stamping, and so on). In another implementation, the pivot element creates a pivot axis coincident with a portion of the pivot element. For example, the pivot element may be a living hinge.

A first connecting operation 1010 connects a first hinged component to a second hinged component of the computing device with the pivot element. For example, one of each of the formed leaves of the pivot element in may be mechanically attached to one of the first hinged component and the second hinged component (e.g., via screws and/or an adhesive). For further example, opposite ends of a living hinge may be adhered to the first hinged component and the second hinged component. Multiple discrete living hinges may be used to connect the first hinged component to the second hinged component.

A second creating operation 1015 creates a friction element for the virtual pivot hinge. In some implementations, the friction element includes a friction arm and a coupler. The friction arm has a first end rotatable with reference to a bearing journal and a second end extending away from the bearing journal. The coupler is slidably connected to the second end of the friction arm and rotatable with reference to a bearing housing. More specifically, the friction arm may be formed and then placed onto the bearing journal in a manner that circumscribes the bearing journal. The resulting first bearing between the bearing journal and the friction arm may generate resistance to rotation within the overall virtual pivot hinge. The coupler may be separately formed with a slot extending therethrough. The friction arm is extended through the slot and the coupler is placed into the bearing housing. The resulting second bearing between the bearing housing and the coupler may also generate resistance to rotation within the overall virtual pivot hinge.

In another implementation, the friction element includes a pair of friction arms forming a multi-part friction linkage. The pivot arms are pivotable about one another about a coincident pivot end. Such pivoting may include a resistance to rotation, which is translated to a resistance to rotation within the overall virtual pivot hinge. In other implementations, addition friction arms may be connected to a multi-part friction linkage with greater than 2 links. In various implementations, the friction arms and/or the coupler may be separately formed and then connected together as described above. The friction arm(s) and/or the coupler may be formed using any applicable manufacturing method (e.g., metal-injection molding, other molding techniques, extruding, casting, stamping, and so on).

A second connecting operation 1020 connects the first hinged component to the second hinged component with the friction element. In one implementation, the first hinged component is connected to the second hinged component via the bearing journal and the bearing housing of the friction element. More specifically, the friction element may include mounting brackets that are affixed to the bearing journal and the bearing housing. One or more mounting brackets affixed to the bearing journal may be connected to the first hinged component, while one or more mounting brackets affixed to the bearing housing may be connected to the second hinged component.

In another implementation, the first hinged component is connected to the second hinged component via opposing pivot ends of a multi-part friction linkage. Each connected friction arm is pivotable with reference to the connected hinged component, resulting in at least two pivot points (at each connection to the hinged components) as well as a third pivot point connecting the two friction arms. Implementations with additional friction arms will have additional pivot points. Pivoting about any or all of the pivot points may include a resistance to rotation, which is translated to a resistance to rotation within the overall virtual pivot hinge. The second connecting operation 1020 may connect the friction element, or multiple friction elements, to the first hinged component and the second hinged component in separate physical locations from the pivot element, or multiple pivot elements, connected in the first connecting operation 1010.

The logical operations making up the embodiments of the invention described herein may be referred to variously as operations, steps, objects, or modules and may be performed in any order, adding or omitting operations as desired, unless explicitly claimed otherwise or a specific order is inherently necessitated by the claim language.

An example virtual pivot hinge according to the presently disclosed technology comprises a pivot element connecting a first hinged component to a second hinged component pivotable about a hinge pivot axis and a friction element also connecting the first hinged component to the second hinged component. The friction element includes a first friction arm with a first pivot end rotatable with reference to the first hinged component and a second pivot end extending away from the first hinged component. The friction element also includes a second friction arm with a third pivot end rotatable with reference to the second hinged component and a fourth pivot end extending away from the first hinged component and rotatably connected to the second pivot end of the first friction arm. None of pivot axes of the first, second, third, and fourth pivot ends are coincident with the hinge pivot axis.

In another example virtual pivot hinge according to the presently disclosed technology, the first friction arm is connected to the second friction arm at a pivot, the pivot to provide resistance to rotation to the virtual pivot hinge.

In another example virtual pivot hinge according to the presently disclosed technology, the first friction arm is connected to the first hinged component at a pivot, the pivot to provide resistance to rotation to the virtual pivot hinge.

In another example virtual pivot hinge according to the presently disclosed technology, the second friction arm is connected to the second hinged component at a pivot, the pivot to provide resistance to rotation to the virtual pivot hinge.

In another example virtual pivot hinge according to the presently disclosed technology, the pivot element is a living hinge with the hinge pivot axis coincident with the living hinge.

In another example virtual pivot hinge according to the presently disclosed technology, the pivot element yields no front gap between the first hinged component and the second hinged component.

In another example virtual pivot hinge according to the presently disclosed technology, the pivot element and the friction element lie at separate physical locations between the first hinged component and the second hinged component.

Another example virtual pivot hinge according to the presently disclosed technology further comprises a flexible service loop connecting the first hinged component to the second hinged component as a living hinge opposite the pivot axis of the hinge.

In another example virtual pivot hinge according to the presently disclosed technology, a range of motion of the hinge is approximately 180 degrees.

An example method of manufacturing a virtual pivot hinge for a computing device according to the presently disclosed technology comprises creating a pivot element pivotable about a hinge pivot axis, connecting a first hinged component to a second hinged component with the pivot element, and creating a friction element. The friction element includes a first friction arm with a first pivot end rotatable with reference to the first hinged component and a second pivot end extending away from the first hinged component. The friction element also includes a second friction arm with a third pivot end rotatable with reference to the second hinged component and a fourth pivot end extending away from the first hinged component and rotatably connected to the second pivot end of the first friction arm. None of pivot axes of the first, second, third, and fourth pivot ends are coincident with the hinge pivot axis. The method further includes connecting the first hinged component to the second hinged component with the friction element via the first friction arm and the second friction arm.

In another example method according to the presently disclosed technology, creating the friction element includes forming the first friction arm, forming the second friction arm, and connecting the first friction arm to the second friction arm at a pivot.

In another example method according to the presently disclosed technology, the pivot element connects the first hinged component to the second hinged component at a separate physical location from where the friction element connects the first hinged component to the second hinged component.

An example computing device according to the presently disclosed technology comprises a first hinged component, a second hinged component, a pivot element connecting the first hinged component to the second hinged component pivotable about a hinge pivot axis, and a friction element also connecting the first hinged component to the second hinged component. The friction element includes a first friction arm with a first pivot end rotatable with reference to the first hinged component and a second pivot end extending away from the first hinged component. The friction element also includes a second friction arm with a third pivot end rotatable with reference to the second hinged component and a fourth pivot end extending away from the first hinged component and rotatably connected to the second pivot end of the first friction arm. None of pivot axes of the first, second, third, and fourth pivot ends are coincident with the hinge pivot axis.

In another example computing device according to the presently disclosed technology, the first hinged component and the second hinged component are each one or more of a keyboard, a display screen, a touchscreen, a touchpad, a kickstand, and a screen cover.

In another example computing device according to the presently disclosed technology, the pivot element maintains a consistent gap spacing between the first hinged component and the second hinged component throughout a range of motion of the pivot element.

Another example computing device according to the presently disclosed technology further comprises a flexible service loop connecting the first hinged component to the second hinged component as a living hinge opposite the first hinged component and the second hinged component from the pivot axis.

In another example computing device according to the presently disclosed technology, the flexible service loop conceals the pivot element and the friction element.

In another example computing device according to the presently disclosed technology, one or both of the first hinged component and the second hinged component includes venting apertures, wherein the flexible service loop conceals the venting apertures.

Another example computing device according to the presently disclosed technology further comprises electronic connections between the first hinged component and the second hinged component, wherein the flexible service loop conceals the electronic connections.

In another example computing device according to the presently disclosed technology, the flexible service loop includes a pocket to store a stylus.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A virtual pivot hinge comprising:
    a pivot element connecting a first hinged component to a second hinged component pivotable about a hinge pivot axis; and
    a friction element also connecting the first hinged component to the second hinged component, the friction element including:
        a first friction arm with a first pivot end rotatable with reference to the first hinged component and a second pivot end extending away from the first hinged component; and
        a second friction arm with a third pivot end rotatable with reference to the second hinged component and a fourth pivot end extending away from the first hinged component, the fourth pivot end of the second friction arm directly rotatably connected to the second pivot end of the first friction arm, wherein none of pivot axes of the first, second, third, and fourth pivot ends are coincident with the hinge pivot axis.

2. The virtual pivot hinge of claim 1, wherein the first friction arm is connected to the second friction arm at a pivot, the pivot to provide resistance to rotation to the virtual pivot hinge.

3. The virtual pivot hinge of claim 1, wherein the first friction arm is connected to the first hinged component at a pivot, the pivot to provide resistance to rotation to the virtual pivot hinge.

4. The virtual pivot hinge of claim 1, wherein the second friction arm is connected to the second hinged component at a pivot, the pivot to provide resistance to rotation to the virtual pivot hinge.

5. The virtual pivot hinge of claim 1, wherein the pivot element is a living hinge with the hinge pivot axis coincident with the living hinge.

6. The virtual pivot hinge of claim 1, wherein the pivot element yields no front gap between the first hinged component and the second hinged component.

7. The virtual pivot hinge of claim 1, wherein the pivot element and the friction element lie at separate physical locations between the first hinged component and the second hinged component.

8. The virtual pivot hinge of claim 1, further comprising:
    a flexible service loop connecting the first hinged component to the second hinged component as a living hinge opposite the pivot axis of the hinge.

9. The virtual pivot hinge of claim 1, wherein a range of motion of the hinge is approximately 180 degrees.

10. The virtual pivot hinge of claim 1, wherein the second pivot end is rotatably connected to the fourth pivot end via a collar rotatable on a shaft.

11. A method of manufacturing a virtual pivot hinge for a computing device comprising:
    creating a pivot element pivotable about a hinge pivot axis;
    connecting a first hinged component to a second hinged component with the pivot element;
    creating a friction element including:
        a first friction arm with a first pivot end rotatable with reference to the first hinged component and a second pivot end extending away from the first hinged component; and
        a second friction arm with a third pivot end rotatable with reference to the second hinged component and a fourth pivot end extending away from the first hinged component, the fourth pivot end of the second friction arm directly rotatably connected to the second pivot end of the first friction arm, wherein none of pivot axes of the first, second, third, and fourth pivot ends are coincident with the hinge pivot axis; and
    connecting the first hinged component to the second hinged component with the friction element via the first friction arm and the second friction arm.

12. The method of claim 11, wherein creating the friction element includes:
    forming the first friction arm;
    forming the second friction arm; and
    connecting the first friction arm to the second friction arm at a pivot.

13. The method of claim 11, wherein the pivot element connects the first hinged component to the second hinged component at a separate physical location from where the friction element connects the first hinged component to the second hinged component.

14. A computing device comprising:
    a first hinged component;
    a second hinged component;
    a pivot element connecting the first hinged component to the second hinged component pivotable about a hinge pivot axis; and
    a friction element also connecting the first hinged component to the second hinged component, the friction element including:
        a first friction arm with a first pivot end rotatable with reference to the first hinged component and a second pivot end extending away from the first hinged component; and
        a second friction arm with a third pivot end rotatable with reference to the second hinged component and a fourth pivot end extending away from the first hinged component, the fourth pivot end of the second friction arm directly rotatably connected to the second pivot end of the first friction arm, wherein none of pivot axes of the first, second, third, and fourth pivot ends are coincident with the hinge pivot axis.

15. The computing device of claim 14, wherein the first hinged component and the second hinged component are each one or more of a keyboard, a display screen, a touchscreen, a touchpad, a kickstand, and a screen cover.

16. The computing device of claim 14, wherein the pivot element maintains a consistent gap spacing between the first hinged component and the second hinged component throughout a range of motion of the pivot element.

17. The computing device of claim 14, further comprising:

a flexible service loop connecting the first hinged component to the second hinged component as a living hinge opposite the first hinged component and the second hinged component from the pivot axis.

18. The computing device of claim 17, wherein the flexible service loop conceals the pivot element and the friction element.

19. The computing device of claim 17, wherein one or both of the first hinged component and the second hinged component includes venting apertures, wherein the flexible service loop conceals the venting apertures.

* * * * *